United States Patent
Potter et al.

(10) Patent No.: US 8,694,958 B1
(45) Date of Patent: Apr. 8, 2014

(54) MARKING UP OBJECTS IN CODE GENERATION

(75) Inventors: William Francis Potter, Waddell, AZ (US); Jesung Kim, Westborough, MA (US)

(73) Assignee: The MathWorks, Inc., Natick, MA (US)

( * ) Notice: Subject to any disclaimer, the term of this patent is extended or adjusted under 35 U.S.C. 154(b) by 1709 days.

(21) Appl. No.: 11/855,718

(22) Filed: Sep. 14, 2007

(51) Int. Cl.
*G06F 9/44* (2006.01)

(52) U.S. Cl.
USPC ........... 717/109; 717/104; 717/105; 717/125; 717/135

(58) Field of Classification Search
None
See application file for complete search history.

(56) References Cited

U.S. PATENT DOCUMENTS

| | | | |
|---|---|---|---|
| 7,454,744 B2 * | 11/2008 | Bhogal et al. | 717/122 |
| 7,818,678 B2 * | 10/2010 | Massand | 715/751 |
| 2005/0108689 A1 * | 5/2005 | Hooper et al. | 717/135 |
| 2007/0168959 A1 * | 7/2007 | Bayari et al. | 717/120 |

* cited by examiner

Primary Examiner — Lewis A Bullock, Jr.
Assistant Examiner — Mark Gooray
(74) Attorney, Agent, or Firm — Harrity & Harrity, LLP

(57) ABSTRACT

A system associates at least one review indicator with at least one of multiple elements of a model, where the at least one review indicator indicates whether a corresponding element of the model has or has not been reviewed by a reviewer. The system further displays a status of the at least one review indicator in a user interface.

24 Claims, 11 Drawing Sheets

US 8,694,958 B1

MARKING UP OBJECTS IN CODE GENERATION

BACKGROUND

Computer programming typically involves a creative process by which a programmer writes program code for performing desired functions. After creating the program code, the programmer typically scans through the program code line by line to verify that the code is as the programmer intended (e.g., no omissions and the code is complete). The programmer may then compile the program code and/or debug the code to locate errors that were not detected during the line by line scan of the code.

BRIEF DESCRIPTION OF THE DRAWINGS

The accompanying drawings, which are incorporated in and constitute a part of this specification, illustrate one or more embodiments described herein and, together with the description, explain these embodiments. In the drawings.

DETAILED DESCRIPTION

Figure 1:
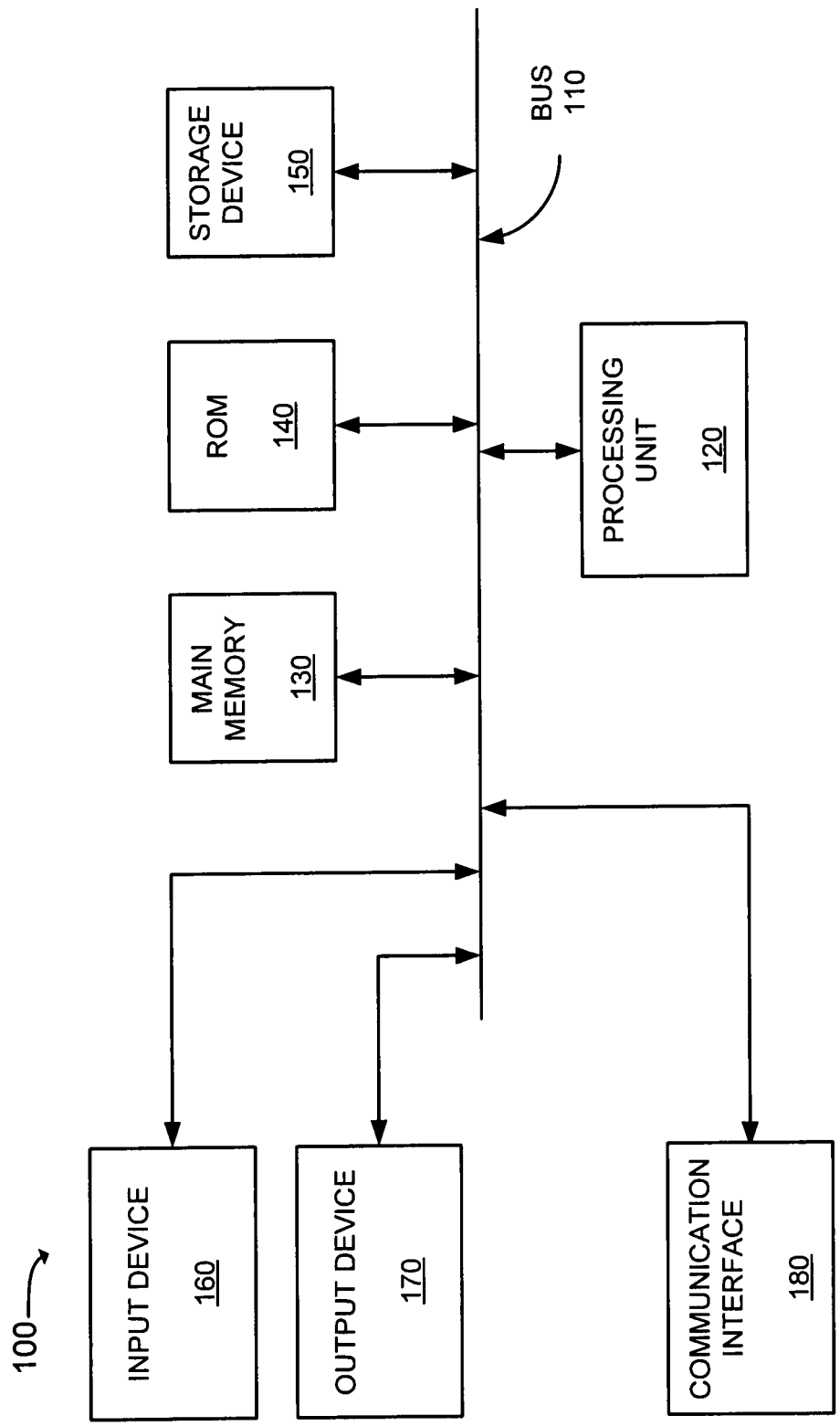
FIG. 1 is a diagram of a system according to an exemplary embodiment.

The following detailed description refers to the accompanying drawings. The same reference numbers in different drawings may identify the same or similar elements. Also, the following detailed description does not limit the invention.

Implementations described herein permit a reviewer to review a model (e.g., a high level graphical system specification) and/or code generated from the model and to provide visual indications of the review through a user interface. A reviewer may be a human or an automated reviewer. A "model," as the term is used herein, is to be broadly interpreted to include a mathematical and/or programmatic construct that may simulate, when executed, a system using one or more blocks. For example, a model may mathematically simulate an electrical system, an aerospace system, a communications system, a hydraulic system, a mechanical system, or a signal processing system. A "block," as the term is used herein, is to be broadly interpreted to include a portion of a model that mathematically simulates a unit or component of the system. In an electrical system, examples of a block of the electrical system may include an integration unit, a delay unit, a summation unit, a product unit, a lookup table, a multiplexer (MUX), a switch, a signal selector, a bus selector, etc. Each block may be used to generate code (e.g., programming code) that include instructions that can be executed to mathematically simulate the associated system.

As described herein, one or more blocks of a model, and one or more lines of the code generated from the model, may have a "check box" associated with it that provides a visual indication of whether one or more reviewers have selected the box (i.e., marked the box with a check mark). Selection, or no selection, of a given check box by a reviewer provides a review status of the associated block or line of code (e.g., selection equals "reviewed" and no selection equals "not reviewed"). For example, if a given check box in the user interface has a check mark in it, indicating that the reviewer has selected it, then the associated block or line of code has been reviewed by the reviewer. A reviewer may be human or an automated process and/or a combination of the two.

Selection of a check box associated with a block may result in check boxes associated with sections of code that were generated from the block being automatically selected (i.e., automatically marked with a check mark). A section of code may include one or more lines of code and/or one or more logical sections of code, such as, for example, a function, a class definition, a conditional statement and associated statements, etc. Alternatively, selections of check boxes of lines of code associated with a block may result in a check box associated with the block being automatically selected.

In one embodiment, a reviewer may follow a hierarchy of a model instead of reading through the generated code, when reviewing the model. The reviewer may visit one or more blocks in the model, mark at least some of the visited model blocks as reviewed, and then review the lines of code that correspond to the block (e.g., check boxes associated with these lines of code may be automatically marked up).

Implementations described herein, therefore, provide a model and generated code review interface that graphically depicts a review status of each block and line of code associated with the model. Use of the model and generated code review interface by a reviewer enables an easy determination of which blocks or lines of code have been already reviewed, and which blocks or lines of code need to be reviewed by the reviewer.

Exemplary System

FIG. 1 is a diagram of a system 100 that may implement a modeling system, which includes a review interface for reviewing a model and generated code, according to an exemplary embodiment. As shown, the system 100 may include a bus 110, a processing unit 120, a main memory 130, a read only memory (ROM) 140, a storage device 150, an input device 160, an output device 170, and a communication interface 180. Bus 110 may include a path that permits communication among the elements of system 100.

Processing unit 120 may include a processor, microprocessor, or processing logic that may interpret and execute instructions. Main memory 130 may include a random access memory (RAM) or another type of dynamic storage device that may store information and instructions for execution by processing unit 120. ROM 140 may include a ROM device or another type of static storage device that may store static information and instructions for use by processing unit 120. Storage device 150 may include a magnetic and/or optical recording medium and its corresponding drive.

Input device 160 may include a mechanism that permits an operator to input information to system 100, such as a keyboard, a mouse, a pen, a touchpad, voice recognition and/or biometric mechanisms, etc. Output device 170 may include a mechanism that outputs information to the operator, including a display, a printer, a speaker, etc. In alternative embodiments, the output device 170 and the input device 160 may be connected to other system elements through a network, rather than through the bus 110. Communication interface 180 may include any transceiver-like mechanism that enables system 100 to communicate with other devices and/or systems. For example, communication interface 180 may include mechanisms for communicating with another device or system via a network.

System 100, consistent with exemplary implementations, may perform certain processes, as will be described in detail below. System 100 may perform these processes in response to processing unit 120 executing software instructions contained in a computer-readable medium, such as memory 130. A computer-readable medium may be defined as a physical or logical memory device and/or carrier wave.

The software instructions may be read into memory 130 from another computer-readable medium, such as data storage device 150, or from another device via communication interface 180. The software instructions contained in memory 130 may cause processor 120 to perform processes that will be described later. Alternatively, hardwired circuitry may be used in place of or in combination with software instructions to implement processes consistent with exemplary implementations. Thus, implementations are not limited to any specific combination of hardware circuitry and software.

Exemplary Simulator

Figure 2:
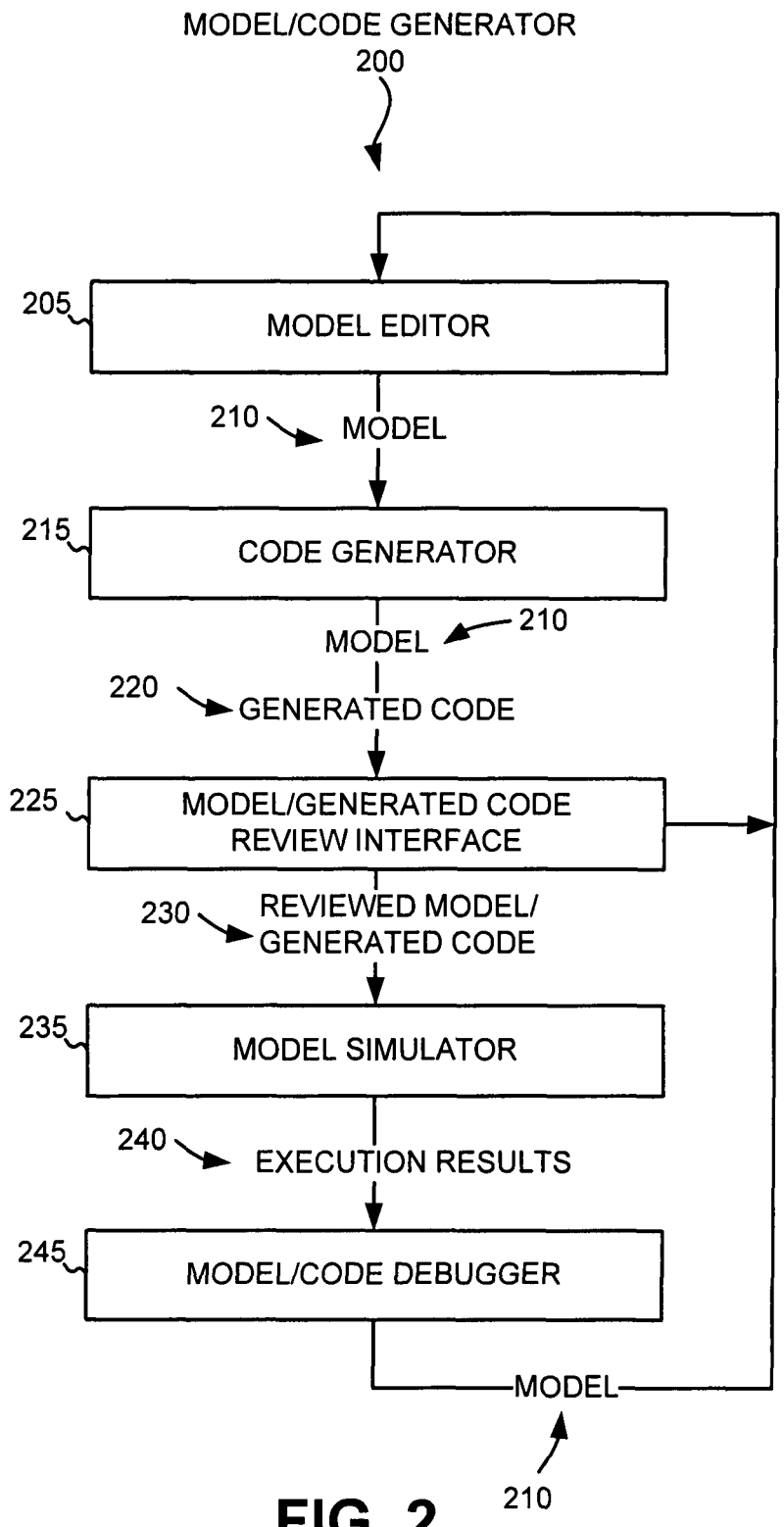
FIG. 2 is an exemplary functional diagram of a simulator that may be implemented by the system of FIG. 1.

FIG. 2 is an exemplary functional diagram of a model/code generator 200 that may be implemented by system 100. Model/code generator 200 may include a model editor 205, a code generator 215 and a model/generated code review interface 225. In some implementations, model/code generator 200 may additionally include a model simulator 235 and a model/code debugger 245. In one implementation, model/code generator 200 may be implemented by sets of instructions that may be stored in memory 130, ROM 140 and/or storage device 150 for execution by processing unit 120. In alternative embodiments, model/code generator 200 may provide only one or more of the model editor 205, model code generator 215, model review interface 225, model simulator 235, and model debugger 245. Any of the above system parts may be provided separately or not at all, as deemed appropriate by one of skill in the art. Model/code generator 200 may include additional components not shown in FIG. 2. For example, model/code generator 200 may also include a requirements module that permits the entry and storage of requirements that identifies any necessary attributes, capabilities, characteristics or qualities of the model. Model/code generator 200 may also include a testing module that may store test suites for a model and may perform code coverage and model coverage tests of the model. The test suites may include test cases that may input into the model to demonstrate that the model performs a specified set of behaviors.

Model editor 205 may provide a user interface that may be used to enter a model of a system. The model may include one or more blocks that model sub-portions or units of the system. Model editor 205 may include or be associated with a block library from which a user may select (e.g., drag and drop) specific blocks and place them into the model. For example, if the user is creating a model of an electrical system, the user may select an integration unit, a product unit, a switch and/or a multiplexer from the block library and may drag and drop the different blocks into model editor 205. Model editor 205 also may permit the user to organize the blocks of the model into a hierarchy of subsystems. The user may designate specific blocks and/or signals as being part of specific subsystems, thus, creating a hierarchy of subsystems. Model editor 205 may further permit the user to segment the model into design components to model, and simulate and verify each component independently. When the user has finished creating the model, model editor 205 may produce a finished model 210 that may be supplied to model code generator 215.

Code generator 215 may generate program code that corresponds to each block of model 210. Each block from the block library may be associated with one or more lines of program code. Model code generator 215 generates the one or more lines of program code for each corresponding block in model 210 to produce generated code 220. Model 210 and generated code 220 may be provided to model/generated code review interface 225.

Model/generated code review interface 225 may provide one or more displays of model 210 and generated code 220 that include a check box associated with each block of model 210 and each line of code of generated code 220. A reviewer reviewing model 210 and generated code 220 using review interface 225 may mark-up selected check boxes associated with blocks and/or lines of code when the reviewer has reviewed the block and/or line of code associated with a respective check box.

Model simulator 235 may simulate the system represented by model 210. Model simulator 235 may use "solvers" that include numerical integration algorithms that calculate system dynamics of model 210 over time using information contained in model 210. Model simulator 235 may support the simulation of various systems, including, for example, continuous-time (analog) systems, discrete-time (digital) systems, discrete-event systems, hybrid (mixed-signal) systems and multi-rate systems of any size. Execution of model 210 may produce execution results 240.

Model/code debugger 245 may permit the user to examine simulation results and locate and diagnose unexpected behavior in model 210. Debugger 245 permits the user to step through a simulation and examine simulation results 240 at each step. Debugger 245 may permit the user to set breakpoints, control simulation execution and display model information.

Although FIG. 2 shows exemplary functional components of model/code generator 200, in other implementations, model/code generator 200 may include fewer, different or additional components than depicted in FIG. 2. For example, in addition to, or instead of, model simulator 235, model/code generator 200 may include a target embedded system into which generated code 220 may be deployed after being reviewed. In this embodiment, the generated code may be executed on the target embedded system while data is communicated between the target embedded system and the host on which the model is executed. Alternatively, an instruction set simulator may be employed that simulates the behavior of the target embedded system, possibly running on the host, while communicating data to the modeling environment. The target embedded system may include a safety critical environment, where review of generated code 220 prior to deployment is very important. Moreover, one or more of the acts described as being performed by one of the components of FIG. 2 may be performed by one or more other components of FIG. 2.

Model/code generator 200 may be implemented in a "technical computing environment (TCE)." A "technical computing environment (TCE)," as the term is used herein, is to be broadly interpreted to include any hardware and/or software based logic that provides a computing environment that allows users to perform tasks related to disciplines, such as, but not limited to, mathematics, science, engineering, medicine, business, etc. In one implementation, a TCE may include a dynamically-typed programming language (e.g., the M language) that can be used to express problems and/or solutions in mathematical notations. For example, one or more languages provided in a TCE may use an array as a basic element, where the array may not require dimensioning. A TCE may be adapted to perform matrix and/or vector formulations that can be used for data analysis, data visualization, application development, simulation, modeling, algorithm development, etc. These matrix and/or vector formulations may be used in many areas, such as statistics, image processing, signal processing, control design, life sciences modeling, discrete event analysis and/or design, state based analysis and/or design, etc.

A TCE may further provide mathematical functions and/or graphical tools (e.g., for creating plots, surfaces, images, volumetric representations, etc.). In one implementation, a TCE may provide these functions and/or tools using toolboxes (e.g., toolboxes for signal processing, image processing, data plotting, parallel programming, etc.). In another implementation, a TCE may provide these functions as block sets. In still another implementation, a TCE may provide these functions in another way, such as via a library, etc.

A TCE may be implemented as a text-based environment (e.g., MATLAB®; Octave; Python; Comsol Script; MATRIXx from National Instruments; Mathematica from Wolfram Research, Inc.; Mathcad from Mathsoft Engineering & Education Inc.; Maple from Maplesoft; Extend from Imagine That Inc.; Scilab from The French Institution for Research in Computer Science and Control (INRIA); Virtuoso from Cadence; Modelica or Dymola from Dynasim; Ptolemy from the University of California at Berkeley; etc.), a graphically-based environment (e.g., Simulink®, Stateflow®, SimEvents™, etc., by The MathWorks, Inc.; VisSim by Visual Solutions; LabView® by National Instruments; Dymola by Dynasim; SoftWIRE by Measurement Computing; WiT by DALSA Coreco; VEE Pro or SystemVue by Agilent; Vision Program Manager from PPT Vision; Khoros from Khoral Research; Gedae by Gedae, Inc.; Scicos from (INRIA); Virtuoso from Cadence; Rational Rose from IBM; Rhopsody or Tau from Telelogic; aspects of a Unified Modeling Language (UML) or SysML environment; etc.), or another type of environment, such as a hybrid environment that includes one or more of the above-referenced text-based environments and one or more of the above-referenced graphically-based environments.

Exemplary Model/Code Review User Interface

FIGS. 3-6 depict the use of model/code review user interface 225 according to various exemplary embodiments.

Figure 3:
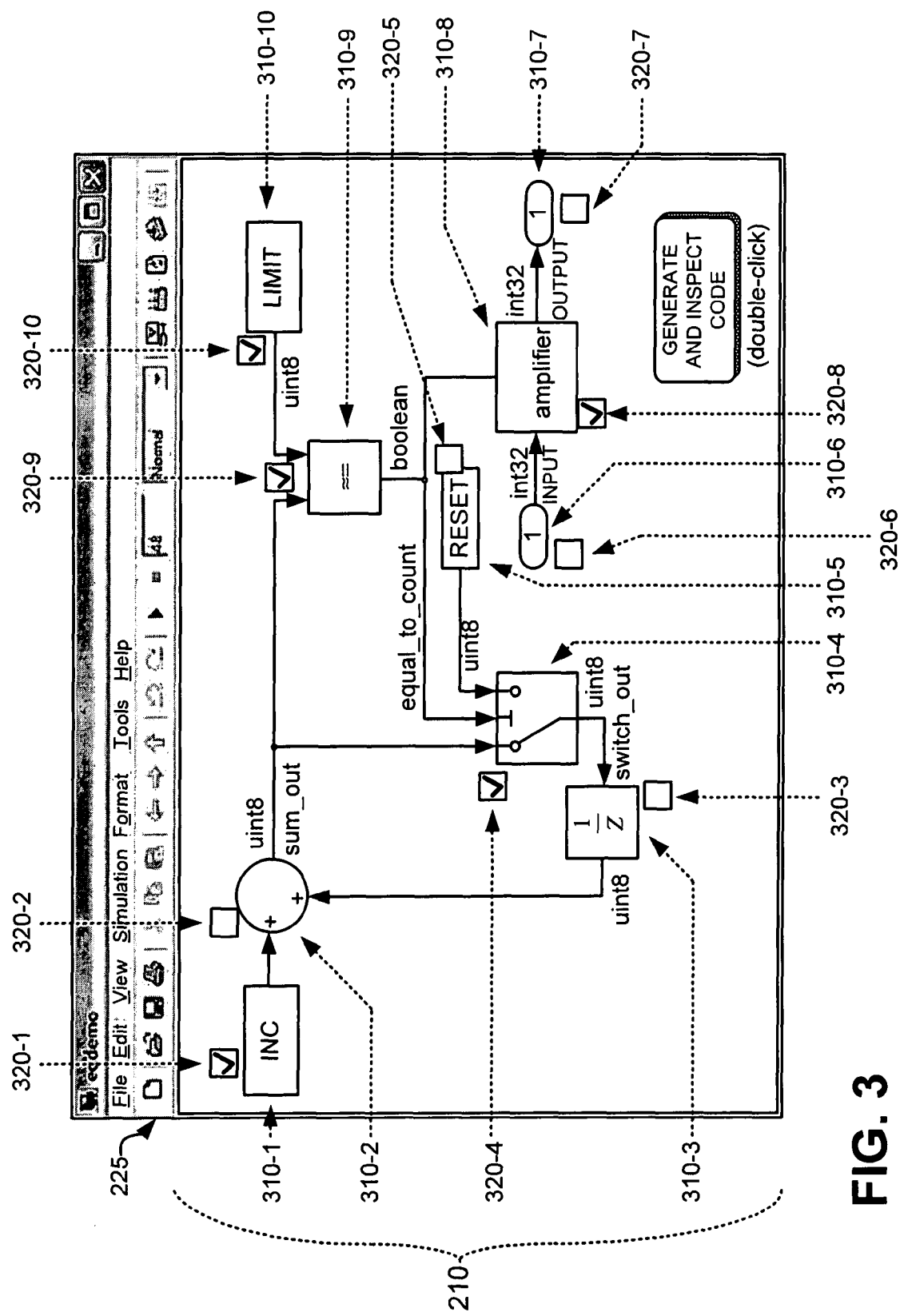
FIG. 3 is an exemplary diagram of a model review interface.

FIG. 3 illustrates model/generated code review interface 225 according to a first exemplary embodiment. Review interface 225 of FIG. 3 displays an exemplary model 210 that includes multiple blocks 310-1 through 310-10 associated with multiple check boxes 320-1 through 320-10. Selection of a check box 320 associated with a block 310 of model 210 by a user may cause the check box 320 to be marked-up indicating that the block 310 has been reviewed (e.g., a check mark appears in the check box).

Figure 4:
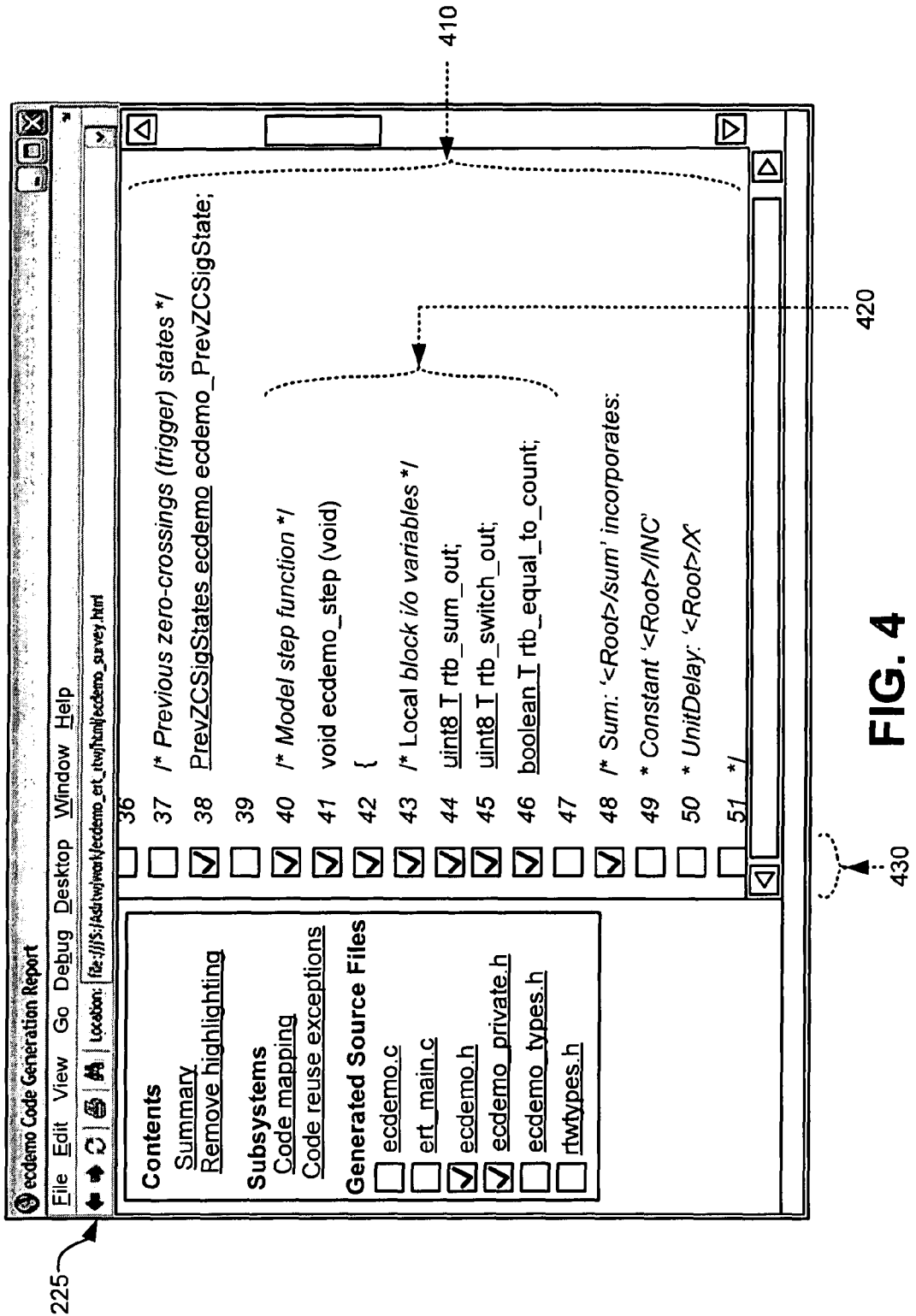
FIG. 4 is an exemplary diagram of a generated code review interface.

FIG. 4 illustrates model/generated code review interface 225 according to another exemplary embodiment. Review interface 225 of FIG. 4 displays lines 410 of exemplary code generated from model 210 of FIG. 3 in association with corresponding check boxes 430. Selection of a check box 430 associated with a line of generated code 410 causes the check box 430 to be marked-up indicating that line of generated code has been reviewed (e.g., a check mark appears in the check box). Lines 410 of code may include one or more subsets of lines of code (one subset 420 shown by way of example) that each correspond to a block of model 210. The presence of a review indicator (e.g., checkbox) in association with a given line of code may be dependent upon the character of the line of code. For example, if the line of code is a "comment line," a review indicator may not be present. Additionally, the number of review indicators associated with a given line of code may also be dependent upon the character of the line of code. For example, if the line of code includes an "if" statement, two review indicators may be presented, one indicating review of a "true" evaluation and one indicating a review of a "false" evaluation. As another example, if the "if" statement is a disjunction of logical clauses, one review indicator (e.g., checkbox) may be present for each clause.

Figure 5:
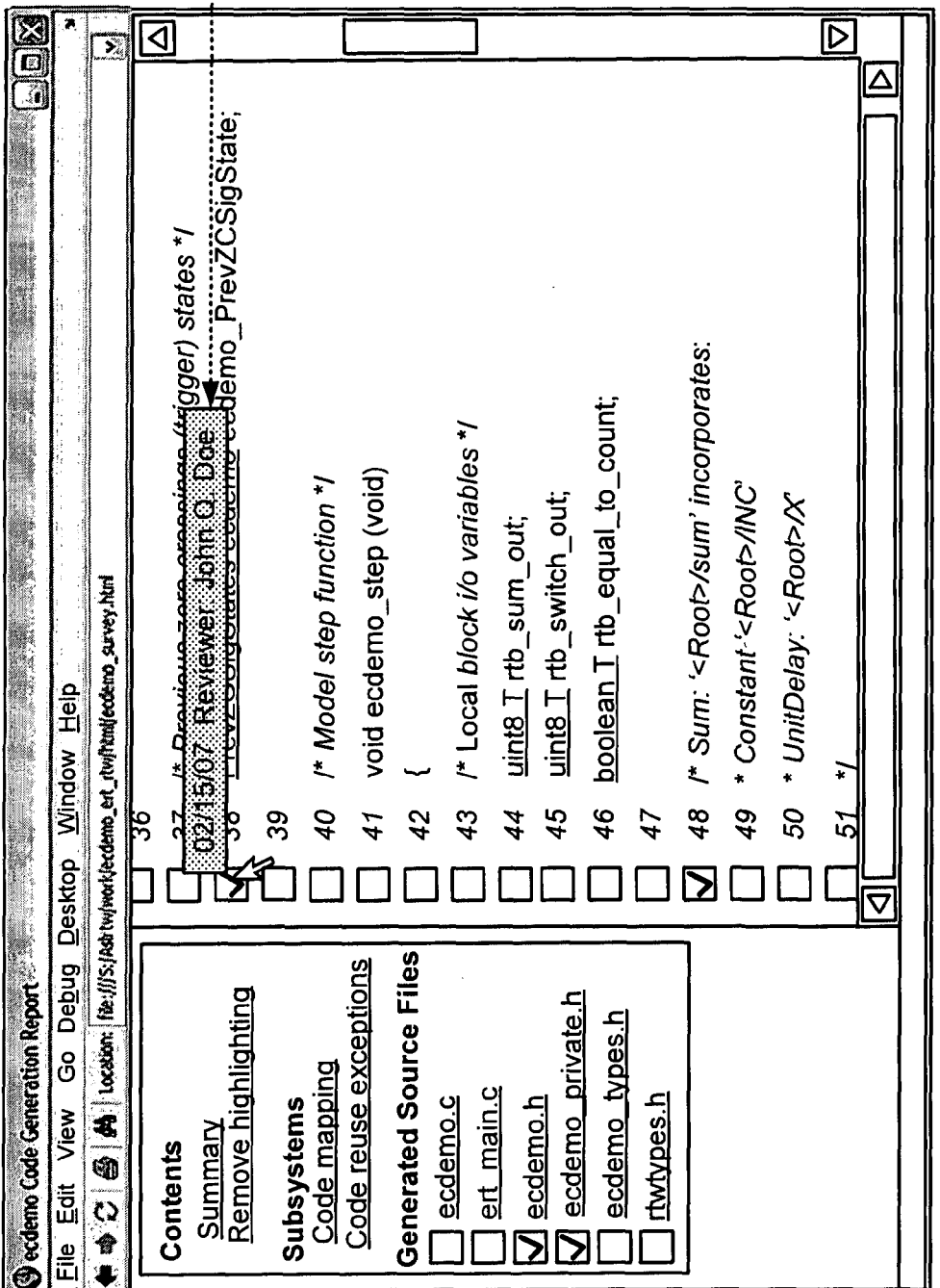
FIG. 5 is a diagram of a generated code review interface providing an indication of a reviewer for a particular line of code.

FIG. 5 illustrates the review interface 225 of FIG. 4 in a circumstance where a reviewer hovers a cursor (e.g., a mouse-over) over a check box next to a line of generated code. As shown in FIG. 5, hovering the cursor over the check box may cause a field 500 to be displayed that includes information associated with review of the line of generated code. For example, field 500 may include a date and time that a check box was marked up and a name of the reviewer that marked up the check box (e.g., checked the check box) to indicate that the corresponding line of generated code had been reviewed.

Figure 6:
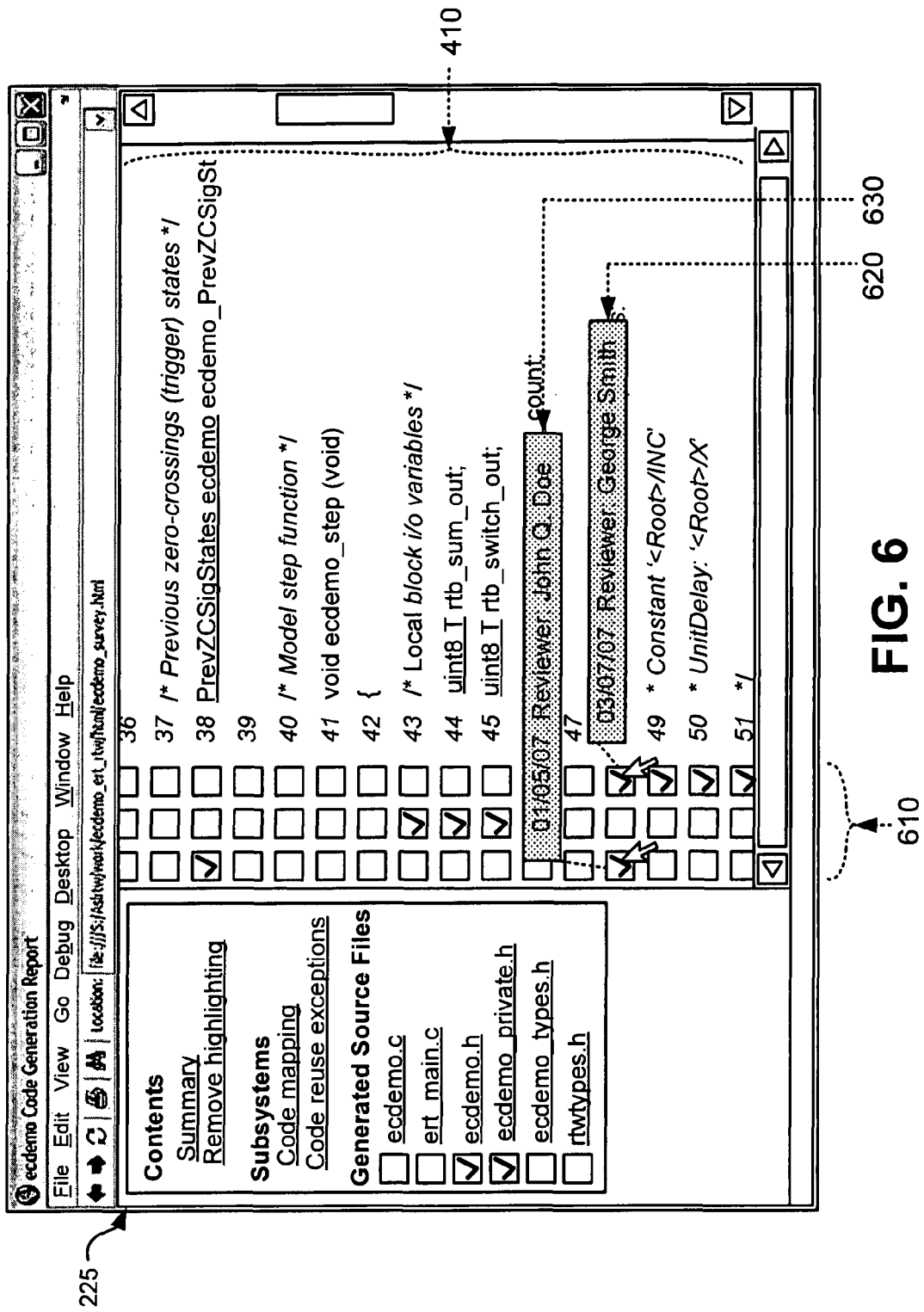
FIG. 6 is a diagram of a generated code review interface providing an indication of multiple reviewers for a particular line of code.

FIG. 6 illustrates model/generated code review interface 225 according to a further exemplary embodiment. Review interface 225 of FIG. 6 may include multiple check boxes 610 in association with each line 410 of code generated from model 210 of FIG. 3. The multiple check boxes 610 associated with each line 410 of code may be used, for example, by multiple different reviewers, or for multiple reviews (e.g., multiple different types of reviews performed by one or more reviewers). FIG. 6 depicts one exemplary implementation in which each one of multiple check boxes 610 corresponds to a different reviewer reviewing the generated code. As shown in FIG. 6, hovering a cursor (e.g., a mouse-over) over a first check box associated with a line of generated code may cause a field 620 to be displayed that includes a name of a reviewer that marked up this check box and a date on which the reviewer marked up the check box. As further shown in FIG. 6, hovering a cursor over a second check box associated with the line of generated code may cause a field 630 to be displayed that includes a name of a reviewer that marked up this check box and a date on which the reviewer marked up the check box. In one embodiment, the content of fields 620 and 630 may be edited while displayed.

Exemplary Process

Figure 7A:
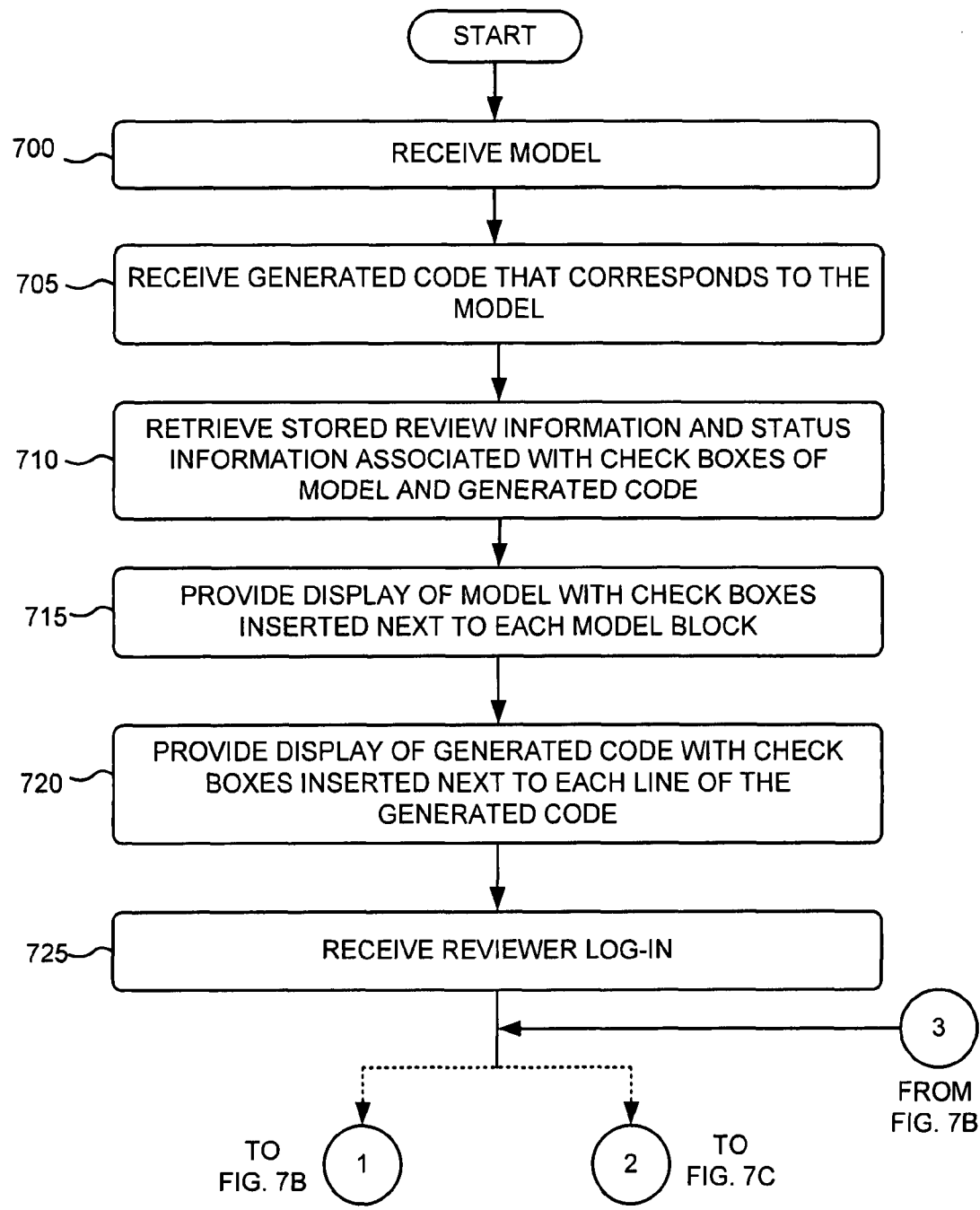
FIGS. 7A-7C are flowcharts of an exemplary process for reviewing blocks of a model and/or lines of generated code.
Figure 7B:
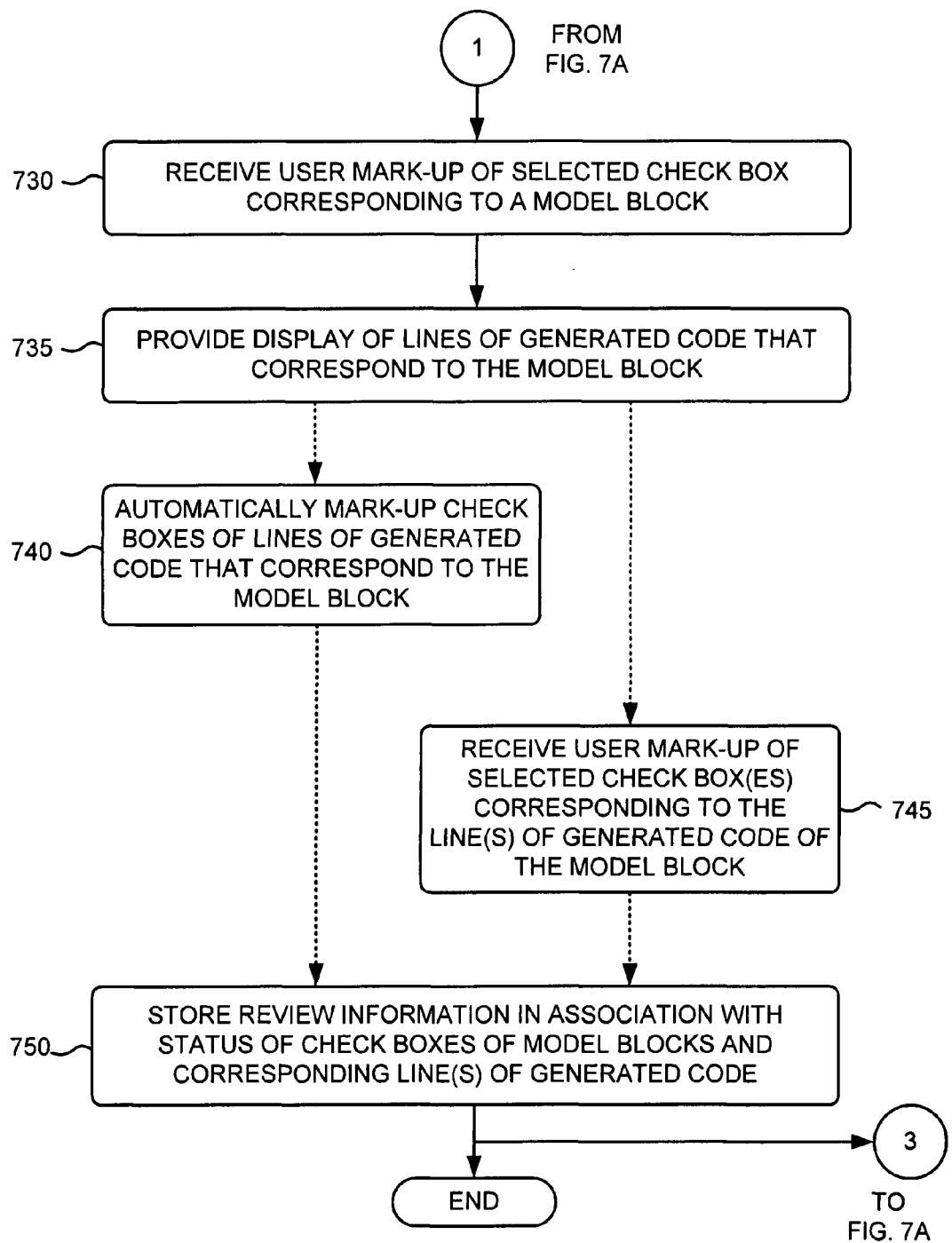
Figure 7C:
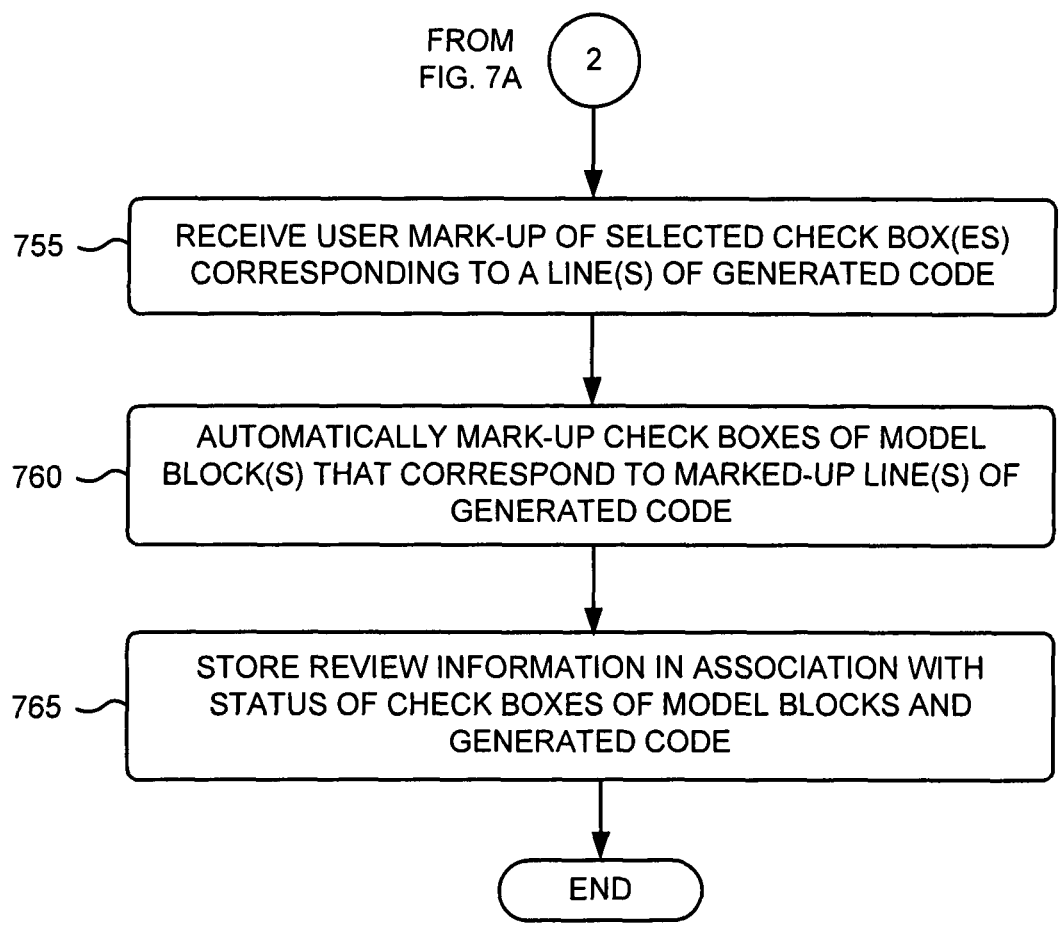

FIGS. 7A, 7B and 7C are flowcharts of an exemplary process for reviewing blocks of a model and/or lines of generated code. The process exemplified by FIGS. 7A, 7B and 7C may be performed by model/generated code review interface 225 of FIG. 2.

The exemplary process may begin with the receipt of a model (block 700). The model may be retrieved from memory (e.g., previously created by a user using model editor 205 and stored in memory), or may be received by model/generated code review interface 225 from model code generator 215.

Model code generator 215 may supply model 210 to model/generated code review interface 225 for review by one or more reviewers.

Generated code that corresponds to the model may be received (block 705). The generated code may be retrieved from memory (e.g., code previously generated from model 210 and stored in memory), or may be received by model/generated code review interface 225 from model code generator 215. Model code generator 215 may generate code 220 based on model 210 received from model editor 205.

Previously stored review information and model/generated code check box status information may be retrieved from memory (block 710). If model 210 and/or generated code 220 were previously at least partially reviewed, and the review information and check box status associated with the review was stored in memory, this previously stored review information and check box status may be retrieved. The previously stored review information and model/generated code check box status information may have resulted from previous performance of an automated or semi-automated analysis (e.g., static analysis) of the model and/or generated code. The automated or semi-automated analysis may be performed by a program (e.g., Simulink's "Model Advisor") over, for example, a model, to see whether the model satisfies certain properties, without actually simulating the model. In an alternative embodiment, run-time analysis may be used instead or in combination with the static analysis. The automated or semi-automated analysis may, for example, automate one or more parts of the human review process, but may not automate other parts of the human review process because of, for example, limitations in the analysis methodology. Thus, check boxes associated with blocks, or other graphical or textual model elements, and/or corresponding lines of code may be automatically marked up and stored as a result of successful automated or semi-automated analysis. In an alternative embodiment, the automated process may produce a range of results, indicating some model sections as being checked entirely, some as not passing the checks, and some as having uncertainty or being unreachable. Various results may be reflected on the marked-up model. In yet another embodiment, users may be supplied with additional information resulting from or helpful for automated analysis. For example, users may be provided with a list of pre- or post-conditions for various model sections, and may be given an opportunity to enter additional checks or restrictions on the code. In yet another embodiment, automated analysis may be repeated more than once, whether interspersed with user review or not.

Figure 9:
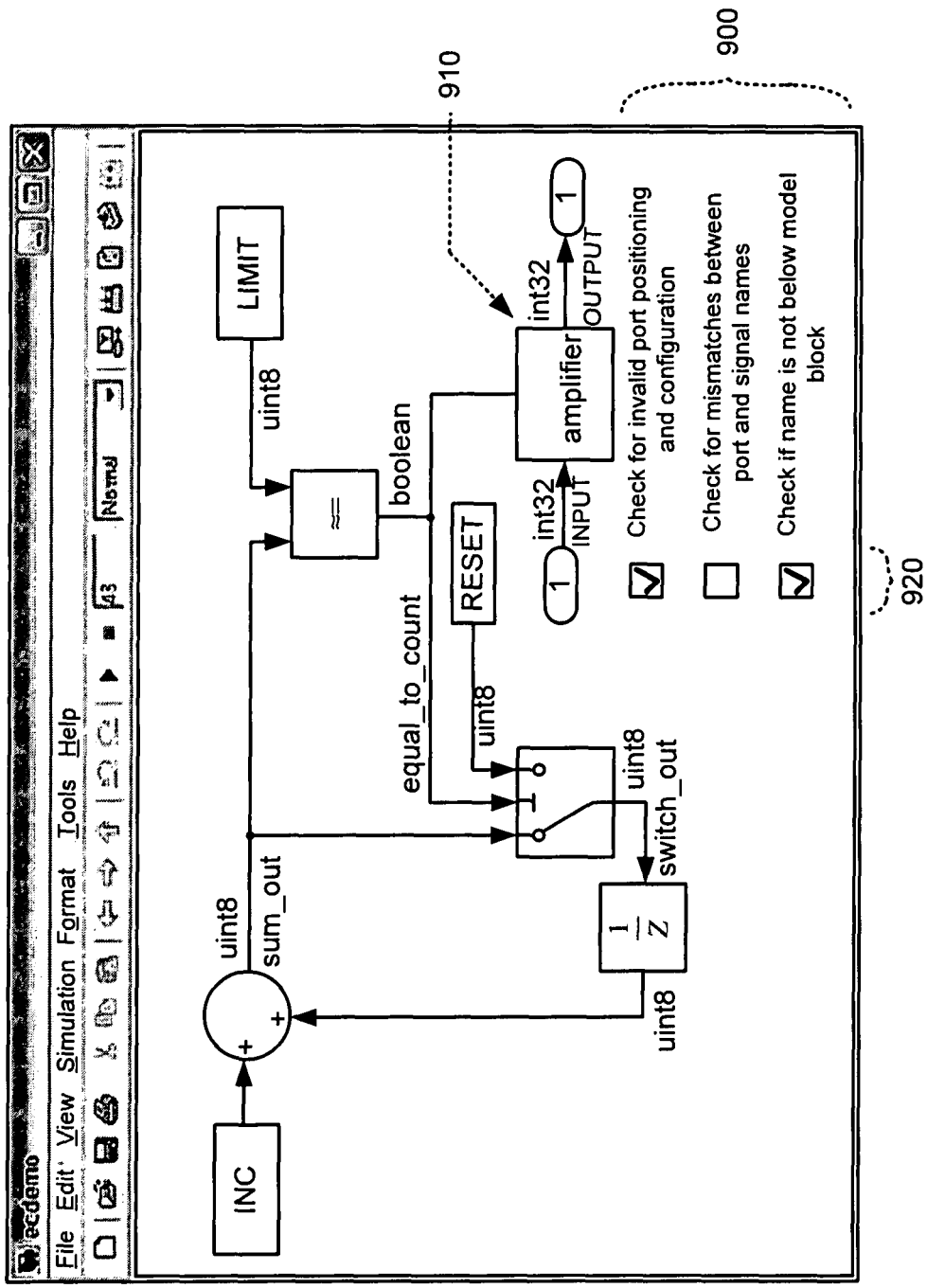
FIG. 9 illustrates an exemplary checklist that results from an automated analysis of a model.

The automated or semi-automated analysis of the model may reveal some potential problems in the model and/or generated code that may require attention. For example, FIG. 9 illustrates the generation of a checklist 900, annotated to a problematic block 910, that includes check boxes 920 associated with potential problems. Checklist 900 may be generated based on results of an exemplary automated analysis of the model. The reviewer can review checklist 900 and mark-up corresponding ones of check boxes 920 associated with potential problems that have been reviewed. After block 710, the reviewer may then, in the subsequent blocks of FIGS. 7A-7C, review the portion(s) of the model or lines of code that were not marked up as a result of the automated or semi-automated analysis.

A display of the model may be provided with check boxes inserted next to each block (block 715). One or more check boxes may be automatically associated with each block of model 210 and then displayed by review interface 225. FIG. 3 illustrates an example of model 210 being displayed by review interface 225, with check boxes 320-1 through 320-10 being inserted next to each respective block 310-1 through 310-10. The status of each check box (e.g., checked or not checked) may be modified based on any check box status information retrieved from memory in block 715. In one implementation, the display of the model with check boxes inserted next to each block may be printed out in a hard copy format such that a reviewer may review the model, block by block, and physically check each check box of reviewed blocks (e.g., check with a pen or pencil).

A display of the generated code may be provided with check boxes inserted next to each line of the generated code (block 720). One or more check boxes may be automatically associated with each line of the generated code and then displayed by review interface 225. FIG. 4 illustrates an example of lines of code 410 being displayed by review interface 225 with a check box 430 being inserted next to each line of code. The status of each check box (e.g., checked or not checked) may be modified based on any check box status information retrieved from memory in block 715. In one implementation, the display of the generated code with check boxes inserted next to each line of the generated code may be printed out in a hard copy format such that a reviewer may review the lines of code, line by line, and physically check each check box of reviewed lines of code (e.g., check with a pen or pencil).

A reviewer log-in may be received (block 725). A reviewer that desires to review model 210 or generated code 220 may provide log-in information (e.g., username and password). If review interface 225 accepts the log-in information, then review interface 225 may permit the logged in reviewer to alter that status of check boxes associated with model 210 or generated code 220. The reviewer may, for example, mark up check boxes to indicate that the corresponding block or line of code has been reviewed, or may cause previously marked up check boxes to revert to an unmarked status (e.g., not checked). Subsequent to reviewer log-in, the exemplary process of FIGS. 7A-7C may continue alternatively at either block 730 (in the case of the reviewer initially reviewing blocks of model 210) or block 755 (in the case of the reviewer initially reviewing lines of generated code). Reviewer privileges may be different for different reviewers such that each reviewer may only be allowed to perform certain actions when logged-in. For example, one reviewer may have the review privilege of reverting a check box status back to "unreviewed" from "reviewed", whereas another reviewer may not be allowed to revert a check box status back to "unreviewed" from "reviewed."

User mark-up of a selected check box corresponding to a block may be received (block 730). For example, the user may hover a cursor (e.g., a mouse-over) over a check box and select the check box (e.g., click on the check box). Upon selection of the check box, review interface 225 may cause a check mark to appear in the check box, indicating that the corresponding block has been reviewed. A display of lines of generated code that correspond to the block may be provided (block 735). Review interface 225 may provide a display of the lines of generated code that corresponds to the block. For example, as shown in FIG. 4, a set 420 of lines of code, which corresponds to a block, may be displayed. Subsequent to block 735, blocks 740 or 745 may be alternatively performed. In another implementation, a review log may be displayed that can show the review status of model elements along with information associated with review of the model elements (e.g., who last reviewed a model element, a time associated with a most recent change to a review status, etc.) For example, in the case of multiple lines of code which correspond to one block, if the reviewer hovers over the block, a field may appear that shows the lines of generated code for that block and their review status.

Check boxes of lines of generated code that correspond to the block may be automatically marked-up (block 740). For example, as shown in FIG. 4, each check box 430 associated with the set 420 of lines of code may be automatically marked-up (e.g., checked) upon marking up of the corresponding block.

User mark-up of selected check box(es) corresponding to the line(s) of generated code of the block may be received (block 745). For example, the user may hover a cursor (e.g., a mouse over) over each check box 430 associated with the set 420 of lines of code, shown in FIG. 4, and select each check box 430 individually (e.g., click on the check box) to mark-up each check box 430. Review information may be stored in association with the status of check boxes of blocks and corresponding line(s) of generated code (block 750). Review information that may include a date and time at which the reviewer reviewed each block or line of code, identification information associated with the reviewer, and a status (e.g., checked or not checked) associated with each check box may be stored in memory. The review information may be stored together with the model, code, requirements or tests in, for example, a file or database. Alternatively, the review information may be stored separately from the model, code, requirements or tests.

Subsequent to block 725, user mark-up of selected check box(es) corresponding to a line(s) of generated code may be received (block 755). For example, the user may hover a cursor (e.g., a mouse over) over each check box 430 associated with reviewed lines of code and select each check box 430 (e.g., click on the check box) to mark-up each check box 430, as shown in FIG. 4. Check boxes of block(s) that correspond to marked-up line(s) of generated code may be automatically marked-up (block 760). Each block of model 210, from which the marked-up lines of code were generated, may be automatically marked-up (e.g., checked).

Review information may be stored in association with the status of check boxes of blocks and corresponding line(s) of generated code (block 765). Review information that may include a date and time at which the reviewer reviewed each block or line of code and a status (e.g., checked or not checked) associated with each check box may be stored in memory (e.g., memory 130).

Exemplary Process

Figure 8:
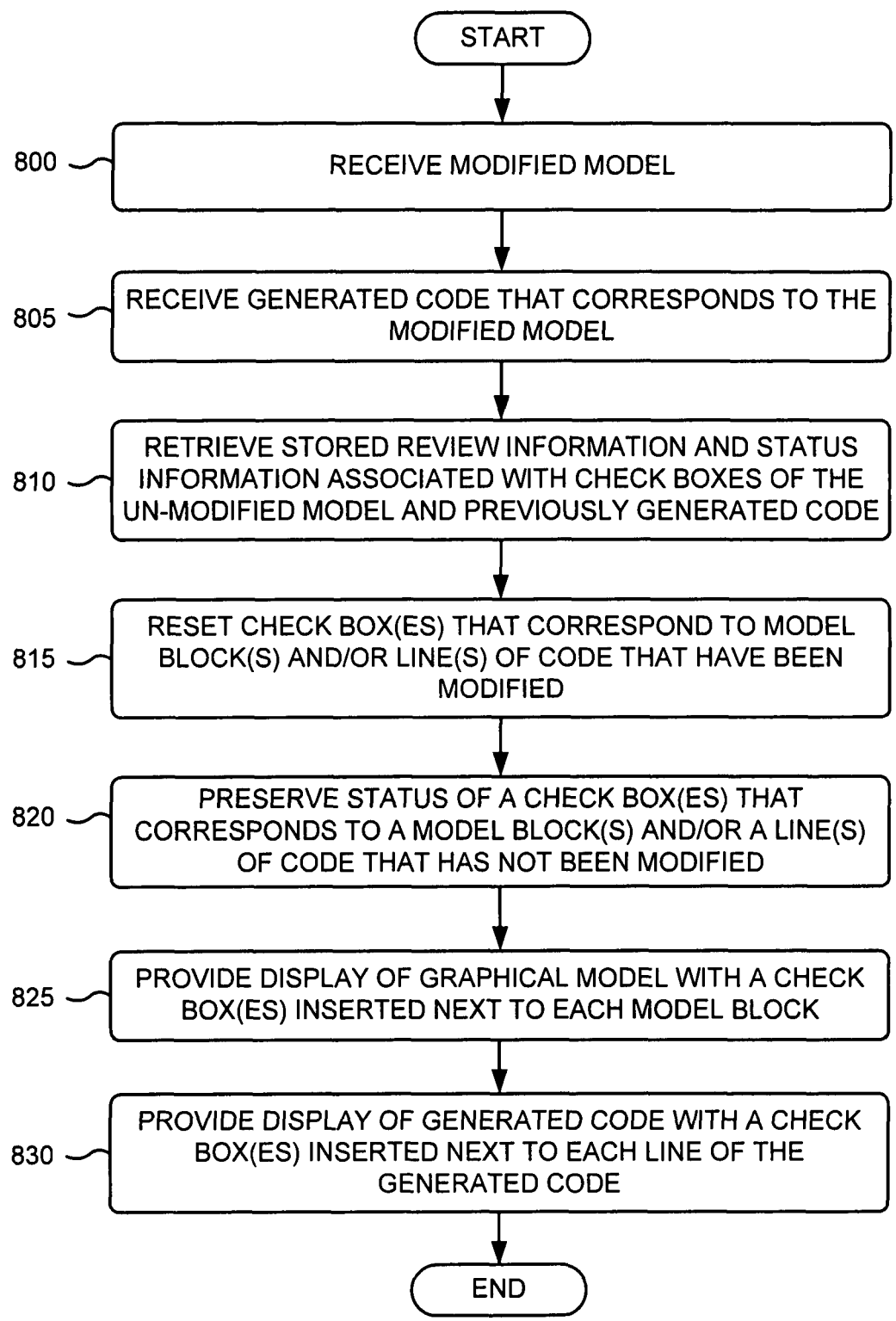
FIG. 8 is a flowchart of an exemplary process for displaying blocks and/or lines of generated code associated with a model that has been modified relative to the conduct of a previous review of the model and/or lines of previously generated code.

FIG. 8 is a flowchart of an exemplary process for displaying blocks and/or lines of generated code associated with a model that has been modified relative to the conduct of a previous review of the model and/or lines of generated code. The process exemplified by FIG. 8 may be performed by review interface 225.

The exemplary process may begin with the receipt of a modified model (block 800). The model may be modified relative to a previously reviewed model. For example, a user may modify a previously generated model using model editor 205 such that one or more blocks of model 210 have been modified. Model code generator 215 may supply the modified model to review interface 225.

Generated code that corresponds to the modified model may be received (block 805). Model code generator 215 may generate code based on the modified model and supply the generated code to review interface 225. The generated code may include one or more different lines of code that correspond to the one or more blocks that have been modified.

Stored review information and status information associated with check boxes of the un-modified model and previously generated code may be retrieved (block 810). Since the un-modified model and/or generated code were previously reviewed, the review information and check box status associated with the review were previously stored in memory and may now be retrieved.

Check box(es) that correspond to block(s) and/or line(s) of code that have been modified may be reset (block 815). For each block and/or line of generated code that has changed relative to the previous un-modified model, respective check boxes may be reset (e.g., unchecked). The status of check box(es) that correspond to block(s) and/or line(s) of code that have not been modified may be preserved (block 820). For each block and/or line of generated code that has not changed relative to the previous un-modified model, the status of respective check boxes (e.g., checked or not checked) may be retained. A display of the model with a check box(es) inserted next to each block may be provided (block 825). The display may include reset check boxes and/or preserved check boxes associated with the blocks of the model. A display of generated code with a check box(es) inserted next to each line of the generated code may be provided (block 830). The display may include reset check boxes and/or preserved check boxes associated with the lines of generated code. Review of the blocks and generated code of the modified model may subsequently proceed in accordance with blocks 725-765 of FIGS. 7A, 7B and 7C.

CONCLUSION

Implementations described herein provide illustration and description, but is not intended to be exhaustive or to limit the invention to the precise form disclosed. Modifications and variations are possible in light of the above teachings, or may be acquired from practice of the invention. For example, while series of acts have been described with regard to FIGS. 7A, 7B, 7C and 8, the order of the acts may be modified in other implementations. Further, non-dependent acts may be performed in parallel. In some implementations, manually marked up check boxes (e.g., as described with respect to block 745 above) may be visually differentiated from automatically marked up check boxes (e.g., as described with respect to block 740 above) when displayed in review interface 225. For example, manually marked up check boxes may be a different color than automatically marked up check boxes. In other implementations, field 500 (FIG. 5) may display comments from the reviewer or a snippet of comments from the reviewer in addition to other information displayed in field 500 (e.g., date and time of review and reviewer identification information). In further implementations, one or more check boxes may be automatically associated with each block of model 210 and each line of generated code 220 and status information associated with the check boxes, along with the model and generated code may be stored prior to being reviewed by a reviewer. In these implementations, the reviewer(s) may subsequently retrieve the model, the generated code and the associated check boxes for review, and any new review information (e.g., check box status) resulting from the review may be stored.

In other implementations, different check boxes, or the marks associated with each check box, may be visually differentiated from one another. For example, a first check box marked up by a first reviewer may be a different color than a second check box marked up by a second reviewer. Furthermore, different checkbox symbols may be used for different checkboxes. For example, a first checkbox symbol (e.g., a checkmark or "P" inserted in a checkbox) may be used for a completed review that passes and a second checkbox symbol (e.g., an "F" inserted in a checkbox) may be used for a completed review that fails (e.g., a model and/or code problem is found). Checkboxes, associated with blocks or lines of code, may also be marked up with different marks for different types of reviews. For example, a model may need to be reviewed twice, first to see whether every block is named properly, and then to see whether every block is annotated with a description. The reviewer may use a different type or color of mark for each different type of review to visualize which type of review has been done for each block.

In further implementations, a generated model 210 may be marked up (e.g., a reviewer marking up one or more associated check boxes) prior to code generation by model code generator 215. In such implementations, if code is generated from a model that already is associated with checkbox markups, some of the checkboxes associated with generated code could be marked up automatically even before the reviewer begins to review the generated code. This may be useful, for example, if the reviewer wants to review code for portions of a model. As an example, a check box associated with block A of a model may be marked up in red and a check box associated with block B of the model may be marked up in blue. When the code is generated based on the model, lines of code generated from block A would have associated check boxes automatically marked up in red and lines of code generated from block B would have associated check boxes automatically marked up in blue.

Exemplary implementations have been described as enabling review of blocks of a model or lines of code. Exemplary implementations may also enable review of any other graphical or textual elements of a model in addition to blocks (e.g., lines, labels, attributes, signals, etc.). Thus, review indicators (e.g., checkboxes) may be associated with may be presented in association with any graphical or textual element of a model, including blocks. In some implementations, a "block" as used herein may also include a state in a state transition diagram (such as a statechart) or an object in an object diagram, etc. In other implementations, a "block" as used herein may additionally refer to any entity that is related to another entity in a graphical model.

Exemplary implementations have also been described as using one or more check boxes for providing review status information. Check boxes, however, may represent only one exemplary review indicator for entering and displaying review status information. Other types of review indicators (e.g., indicators that visually differentiate a reviewed block, line(s) of code, or other model element from an un-reviewed block, line(s) of code or other model element) may also be utilized. Review status information may be entered and displayed to a reviewer(s) in a number of different ways that visually differentiate a reviewed block, line(s) of code, or other model element from an un-reviewed block, line(s) of code or other model element. For example, a model element that has been marked up by a reviewer as having been reviewed can be presented in a differ color relative to a model element(s) that has not been reviewed. As another example, a model element that has been marked up by a reviewer as having been reviewed may be "grayed out," or it can assume a different color relative to its un-reviewed state. Alternatively, a model element (e.g., block, line of code, etc.) may be crossed out by using free hand markup (e.g., before each line of code, in the graphical or textual model, in the requirements document, in the test database, etc.). Review status information may also be combined with model coverage analysis results, where model coverage analysis involves measuring how complete test data input to a model was in testing the model. For example, an element (e.g., model element or line of code) that has been reviewed, but is not covered, can be shown in one color (e.g., purple) whereas an element that has been inspected, but is not covered, can be shown in a different color (e.g., red).

In one exemplary implementation, reviewed model/generated code 230 produced by review interface 225 may be put under a kind of version control so that a given review of the model or generated code may be differenced against other versions. For example, different reviews of a same model may have different review information (e.g., different blocks or lines of code being marked up as having been reviewed). As one example, a first reviewer may have reviewed part of a model on one day, and a second reviewer may have reviewed the part of the model on another day, and the review information may indicate a difference between the two reviews.

In another exemplary implementation, review of a model or generated code may also include checking requirements and tests as well. For example, if a reviewer marks up a block as being reviewed, an associated test may also be marked up (e.g., checked off). Therefore, in various implementations, the user interface may include indicators (e.g., checkboxes) associated with the model, code, requirements and/or tests, any one of these alone, or any combination of model, code, requirements or tests. For example, the user interface may include indicators (e.g., checkboxes) for the blocks of the model and the corresponding requirements. As another example, the user interface may include indicators (e.g., checkboxes) associated with the various requirements of the model (e.g., necessary attributes, capabilities, characteristics or qualities of the model) and indicators associated with the various tests for the model (e.g., code coverage tests, model coverage tests).

In a further exemplary implementation, two or more separate review interfaces 225 may be implemented at different locations and review information may be exchanged between them via, for example, a network. For example, a first reviewer using a first review interface at a first location may change the status of a review indicator and the change may be automatically updated in the second reviewer's review interface at a second location.

It will be apparent that aspects described herein may be implemented in many different forms of software, firmware, and hardware in the implementations illustrated in the figures. The actual software code or specialized control hardware used to implement these aspects is not limiting of the invention. Thus, the operation and behavior of the aspects have been described without reference to the specific software code, it being understood that software and control hardware could be designed to implement the aspects based on the description herein.

No element, act, or instruction used in the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A non-transitory computer-readable medium storing instructions, the instructions comprising:
   one or more instructions, executable by at least one processor, to:
      obtain a model representing a system,
         the model comprising a plurality of elements that correspond to portions of the system, associate at least one first review indicator with at least one of the plurality of elements of the model,
  the at least one first review indicator indicating whether the at least one of the plurality of elements of the model has been reviewed by a first reviewer prior to generating code corresponding to the plurality of elements of the model,
provide, for display, a status of the at least one first review indicator, via a first user interface, to a second reviewer,
generate the code corresponding to the plurality of elements of the model,
simulate at least one of the plurality of elements of the model based on at least one portion of the generated code to conduct a review of the at least one of the plurality of elements of the model,
  the at least one portion of the generated code corresponding to the at least one of the plurality of elements of the model,
associate at least one second review indicator with the at least one of the plurality of elements of the model based on conducting the review of the at least one of the plurality of elements of the model,
provide, for display, a status of the at least one second review indicator, via a second user interface, to the second reviewer reviewing the model,
  the status of the at least one second review indicator indicating that the at least one of the plurality of elements of the model has been reviewed by the second reviewer; and
provide, for display, review information associated with the at least one second review indicator based on receiving a selection of at least one of the at least second review indicator, the at least one of the plurality of elements of the model, or the at least one portion of the generated code,
  the review information being determined based on a difference between a review associated with the at least one first review indicator and a review associated with the at least one second review indicator.

2. The non-transitory computer-readable medium of claim 1, where the instructions further comprise:
one or more instructions, executable by the at least one processor, to:
  compare the at least one first review indicator with the at least one second review indicator to determine the review information, and
  store the review information,
    the review information being associated with an association of the at least one second review indicator with the at least one of the plurality of elements of the model.

3. The non-transitory computer-readable medium of claim 1, where the first reviewer comprises a device.

4. The non-transitory computer-readable medium of claim 1, where the first reviewer is different than the second reviewer.

5. The non-transitory computer-readable medium of claim 1, where at least a portion of the plurality of elements of the model comprise blocks.

6. The non-transitory computer-readable medium of claim 1, where the at least one first review indicator comprises a checkbox.

7. The non-transitory computer-readable medium of claim 1, where the second reviewer is a user of a device that provides the second graphical user interface, and where the instructions further comprise:
  one or more instructions, executable by the at least one processor, to:
    receive a selection of the at least one second review indicator, and
    provide the generated code for display based on the selection.

8. The non-transitory computer-readable medium of claim 1, where the first reviewer comprises the at least one processor.

9. The non-transitory computer-readable medium of claim 1, where the at least one first review indicator comprises a single review indicator associated with each of the plurality of elements of the model.

10. The non-transitory computer-readable medium of claim 1, where the at least one first review indicator comprises multiple first review indicators associated with each of the plurality of elements of the model, and
where the at least one second review indicator comprises multiple second review indicators associated with each of a plurality of sections of the generated code.

11. The non-transitory computer-readable medium of claim 10, where the first reviewer comprises multiple first reviewers,
where the multiple first review indicators comprise respective different first review indicators associated with the multiple first reviewers, and
where the instructions further comprise:
  one or more instructions, executable by the at least one processor, to:
    associate a reviewer identifier with each different first review indicator, and
    provide, for display, the reviewer identifier associated with one of the multiple first review indicators when a cursor is moved in proximity to the one of the multiple first review indicators via the second user interface.

12. The non-transitory computer-readable medium of claim 10, where the multiple first review indicators comprise respective different first review indicators associated with a plurality of different types of review of the model.

13. The non-transitory computer-readable medium of claim 10, where the instructions further comprise:
  one or more instructions, executable by the at least one processor, to:
    receive a selection of the at least one first review indicator, and
    change the status of the at least one first review indicator based on the selection.

14. The non-transitory computer-readable medium of claim 13, where the instructions further comprise:
  one or more instructions, executable by the at least one processor, to:
    store, based on the selection of the at least one review indicator, at least one of:
      a time,
      a date, or
      information identifying the first reviewer.

15. The non-transitory computer-readable medium of claim where the instructions further comprise:
  one or more instructions, executable by the at least one processor, to:
    receive a selection of the at least one review indicator, and
    mark sections of the code, that are associated with one of the plurality of elements of the model, as reviewed by the first reviewer based on the selection of the at least one review indicator.

16. The non-transitory computer-readable medium of claim 1, where the instructions further comprise:
one or more instructions, executable by the at least one processor, to:
receive a selection of another portion of the generated code, and
mark a second element, of the plurality of elements, as having been reviewed based on the selection,
the second element corresponding to the other portion of the generated code.

17. The non-transitory computer-readable medium of claim 1, where the at least one first review indicator provides:
a first visual indication associated with a first type of review of a first element of the at least one of the plurality of elements, and
a second visual indication associated with a second type of review of a second element of the at least one of the plurality of elements,
the first type of review being different than the second type of review, and
the first visual indication being different than then the second visual indication.

18. The non-transitory computer-readable medium of claim 1, where at least one of requirements or tests are associated with at least one of the plurality of elements of the model, and
where the instructions further comprise:
one or more instructions, executable by the at least one processor, to:
change the status of the at least one second review indicator associated with the at least one of the requirements or the tests based on simulating the at least one of the plurality of elements, and
provide the changed status of the at least one second review indicator to the first reviewer.

19. A method comprising:
obtaining a model representing a system,
the model comprising a plurality of blocks, and
obtaining the model being performed by a computer;
associating at least one first review indicator with a first block of the plurality of blocks,
the at least one first review indicator indicating whether the first block has been reviewed, by a first reviewer, prior to generating code for the model, and
associating the at least one first review indicator being performed by the computer;
providing, for display, a status of the at least one first review indicator, via a first user interface, to a second reviewer reviewing the model,
providing the status for display being performed by the computer;
generating code corresponding to the first block,
generating the code being performed by the computer;
simulating the first block based on the code,
simulating the first block being performed by the computer;
associating at least one second review indicator with the first block based on simulating the first block,
associating the at least one second review indicator being performed by the computer;
providing, for display via a second user interface, a status of the at least one second review indicator to a second reviewer,
the status of the at least one second review indicator indicating that the generated code has been reviewed by the second reviewer, and
providing the status of the second review indicator for display being performed by the computer; and
providing, for display, review information associated with the second review indicator based on receiving a selection of at least one of the first block, the second review indicator, or the generated code,
the review information being determined based on a difference between a review associated with the at least one first review indicator and a review associated with the at least one second review indicator, and
providing the review information for display being performed by the computer.

20. The method of claim 19, where providing, for display, the status of the at least one first review indicator includes:
providing, for display, the first review indicator in association with the first block,
the first review indicator indicating that the first block has been reviewed prior to generating the code.

21. A system, comprising:
a memory to store a model and lines of code generated from the model;
a processor to:
obtain the model,
associate at least one first review indicator with one or more blocks included in the model,
the at least one first review indicator indicating whether the one or more blocks have been reviewed by a first reviewer prior to generating code corresponding to the plurality of elements of the model,
provide, for display, a status of the at least one first review indicator, via a first user interface, to a second reviewer,
generate the lines of code based on the model,
simulate the one or more blocks of the model based on a portion of the lines of code to:
conduct a first review of the one or more blocks of the model that correspond to the portion of the lines of code,
associate at least one second review indicator with the one or more blocks based on simulating the one or more blocks,
provide, for display via a second user interface, a status of the at least one second,
the status of the at least one second review indicator indicating that the one or more blocks has been reviewed by the second reviewer, and
provide, for display, review information associated with the at least one second review indicator based on receiving a selection of the at least one second review indicator, the portion of the lines of code, or the one or more blocks,
the review information being determined based on a difference between a review associated with the at least one first review indicator and a review associated with the at least one second review indicator.

22. A system, comprising:
means for obtaining a model;
means for associating at least one first review indicator with one or more blocks of the model,
the at least one first review indicator indicating whether the one or more blocks have been reviewed by a first reviewer prior to generating code for the model,
means for providing, for display, a status of the at least one first review indicator, via a first user interface, to a second reviewer;
means for generating the code for the model;

means for simulating the one or more blocks based on the code to conduct a review of the one or more blocks;
means for associating at least one second review indicator with the one or more blocks of the model based on simulating the one or more blocks,
- the at least one second review indicator indicating that the one or more one or more blocks have been reviewed by a second reviewer;
means for providing, for display, a status of the at least one second review indicator via a second user interface to the second reviewer reviewing the model;
- the status of the at least one second review indicator indicating that the one or more blocks have been reviewed by the second reviewer; and
means for providing, for display, review information associated with the at least one second review indicator based on receiving a selection of the at least one second review indicator or the one or more blocks,
- the review information being determined based on a difference between a review associated with the at least one first review indicator and a review associated with the at least one second review indicator.

23. A non-transitory computer-readable medium, storing instructions, the instructions comprising:
one or more instructions, executable by at least one processor, to:
obtain a model representing a system,
- the model comprising a plurality of elements that correspond to portions of the system,
associate at least one first review indicator with a first element of the plurality of elements of the model,
- the at least one first review indicator indicating whether the first element has been reviewed by a first reviewer prior to generating code corresponding to the plurality of elements of the model,
provide, for display, a status of the at least one first review indicator, via a first user interface, to a second reviewer,
generate the code corresponding to the plurality of elements based on obtaining the model,
simulate the first element based on a portion of the generated code to conduct a review of the first element,
- the portion of the generated code corresponding to the first element,
associate a second review indicator with the first element based on conducting the review of the first element,
provide, for display, a status of the second review indicator, via a second user interface, to the second reviewer reviewing the model,
- the status of the second review indicator indicating that the review of the first element has been conducted by the second reviewer, and
provide, for display, review information associated with the second review indicator based on receiving a selection of at least one of the second review indicator, the first element, or the portion of the generated code,
- the review information being determined based on a difference between a review associated with the first review indicator and a review associated with the second review indicator.

24. The non-transitory computer-readable medium of claim 23, where at least one of the first review indicator or the second review indicator comprise a checkbox.

* * * * *

UNITED STATES PATENT AND TRADEMARK OFFICE
CERTIFICATE OF CORRECTION

| | | |
|---|---|---|
| PATENT NO. | : 8,694,958 B1 | Page 1 of 1 |
| APPLICATION NO. | : 11/855718 | |
| DATED | : April 8, 2014 | |
| INVENTOR(S) | : William Francis Potter et al. | |

It is certified that error appears in the above-identified patent and that said Letters Patent is hereby corrected as shown below:

In the Claims

On claim 15, column 14, line 59, the following should read as follows:

"claim 14, where the instructions further comprise:"

Signed and Sealed this
Sixth Day of January, 2015

Michelle K. Lee
*Deputy Director of the United States Patent and Trademark Office*